(12) United States Patent
Sato et al.

(10) Patent No.: US 8,764,952 B2
(45) Date of Patent: *Jul. 1, 2014

(54) METHOD FOR SMOOTHING A SOLID SURFACE

(75) Inventors: Akinobu Sato, Soka (JP); Akiko Suzuki, Akishima (JP); Emmanuel Bourelle, Musashimurayama (JP); Jiro Matsuo, Kyoto (JP); Toshio Seki, Kyoto (JP); Takaaki Aoki, Kyoto (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 2089 days.

This patent is subject to a terminal disclaimer.

(21) Appl. No.: 10/573,942

(22) PCT Filed: Sep. 29, 2004

(86) PCT No.: PCT/JP2004/014275
§ 371 (c)(1),
(2), (4) Date: Mar. 29, 2006

(87) PCT Pub. No.: WO2005/031838
PCT Pub. Date: Apr. 7, 2005

(65) Prior Publication Data
US 2006/0278611 A1    Dec. 14, 2006

(30) Foreign Application Priority Data

Sep. 30, 2003  (JP) .................. 2003-339566
Mar. 15, 2004  (JP) .................. 2004-072642

(51) Int. Cl.
| | | |
|---|---|---|
| *C23C 14/00* | (2006.01) | |
| *C23C 14/32* | (2006.01) | |
| *C25B 9/00* | (2006.01) | |
| *C25B 11/00* | (2006.01) | |
| *C25B 13/00* | (2006.01) | |
| *B44C 1/22* | (2006.01) | |
| *C03C 15/00* | (2006.01) | |
| *C03C 25/68* | (2006.01) | |
| *C23F 1/00* | (2006.01) | |
| *A61N 5/00* | (2006.01) | |
| *G21G 5/00* | (2006.01) | |
| *G21K 5/10* | (2006.01) | |
| *H01J 37/08* | (2006.01) | |
| *C23C 14/02* | (2006.01) | |
| *H01L 21/302* | (2006.01) | |
| *H01L 21/461* | (2006.01) | |

(52) U.S. Cl.
USPC ............ 204/192.34; 204/192.35; 204/192.37; 204/298.31; 204/298.36; 216/58; 216/63; 216/66; 216/72; 250/492.1; 250/492.2; 250/492.21; 250/492.3; 427/534; 438/712

(58) Field of Classification Search
USPC ................ 438/384, 712; 204/192.34, 192.35, 204/192.37, 298.31, 298.36; 427/404, 534; 250/492.1, 492.2, 492.21, 492.3; 216/58, 63, 66, 72
See application file for complete search history.

(56) References Cited

U.S. PATENT DOCUMENTS

| | | | |
|---|---|---|---|
| 6,375,790 B1 | 4/2002 | Fenner | |
| 6,486,478 B1* | 11/2002 | Libby et al. ............. | 250/492.1 |
| 6,624,081 B2 | 9/2003 | Dykstra et al. | |
| 7,064,927 B2* | 6/2006 | Erickson et al. ............. | 360/135 |
| 7,116,394 B2* | 10/2006 | Bakker et al. ................. | 355/30 |
| 7,231,705 B2* | 6/2007 | Kagami et al. ............. | 29/603.15 |
| 8,178,857 B2* | 5/2012 | Sato et al. ................. | 250/492.3 |
| 8,481,981 B2* | 7/2013 | Suzuki et al. ............. | 250/492.3 |
| 2002/0000552 A1* | 1/2002 | Morimoto et al. ............. | 257/59 |
| 2002/0001680 A1* | 1/2002 | Hoehn et al. ................. | 427/551 |
| 2004/0086752 A1 | 5/2004 | Matsukawa et al. | |
| 2004/0137158 A1* | 7/2004 | Kools et al. ................. | 427/404 |
| 2008/0315128 A1 | 12/2008 | Sato et al. | |
| 2010/0207041 A1 | 8/2010 | Sato et al. | |
| 2010/0230616 A1* | 9/2010 | Suzuki et al. ............. | 250/492.3 |

FOREIGN PATENT DOCUMENTS

| | | | |
|---|---|---|---|
| JP | 02-000316 | | 1/1990 |
| JP | 07-058089 | | 3/1995 |
| JP | 08-120470 | | 5/1996 |
| JP | 08-293483 | | 11/1996 |
| JP | 2001-284252 | | 10/2001 |
| JP | 2003-505867 | | 2/2003 |
| JP | 2003-86865 | | 3/2003 |
| JP | 2003-188156 | | 7/2003 |
| JP | 2004-253437 | | 9/2004 |
| KR | 2006036660 A | * | 5/2006 |
| WO | WO 01/41181 | | 6/2001 |
| WO | WO-01/48794 | | 7/2001 |
| WO | WO 03/048407 | | 6/2003 |
| WO | WO 03001614 A1 | * | 12/2003 |

OTHER PUBLICATIONS

Kitani, H., Toyoda, N., Matsuo, J., Yamada, I. Incident angle dependence of the sputtering effect of Ar-cluster-ion bombardment, Kyoto, Japan, 1997, p. 489-492 [online] [Accessed on Sep. 2, 2010].*

Kumar, V. Novel caged clusters of silicon:Fullerenes, Frank-Kasper polyhedron and cubic, Institute for Materials Research, Tohoku University, Jan. 2003, vol. 26, No. 1, pp. 109-114 [online] [Accessed on Jul. 8, 2011].*

'Orthography' definition. Merriam-Webster Online Dictionary [Accessed on Jul. 8, 2011].*

Toyoda, et al., "Ultra-Smooth Surface Preparation Using Gas Cluster Ion Beams," Japanese Journal of Applied Physics, vol. 41 (2002), pp. 4287-4290. [Accessed on Jul. 14, 2011].*

Toyoda, et al., "Surface smoothing mech,'ufism of gas cluster ion beams," Nuclear Instruments and Methods in Physics Research B 161-163 (2000) 980-985. [Accessed on Jul. 14, 2011].*

Office Action issued on Mar. 30, 2007 for Korean Patent Application No. 10 2006-7005290 with its full English translation.

Yamada, I., et al.; "Materials processing by gas cluster ion beams," Materials Science & Engineering Reports, Elsevier Sequoia, S.A., Lausanne, CH, vol. 34, No. 6, Oct. 30, 2001, pp. 231-295.

EP Office Action 047883418, Jul. 4, 2008, Japan Aviation Electronic.

Yamada, "Cluster ion beam process technology—20 years of R&D history", Nuclear Instruments and Methods in Physics Research, B257, 2007, pp. 632-638.

Yamada, "Basic and Applications of Cluster Ion Beams," The Nikkan Kogyo Shinbun. Ltd., p. 25, Oct. 31, 2006, ISBN 9784526057656.

Toyoda, et al., "Ultra-Smooth Surface Preparation Using Gas Cluster Ion Beams," Japanese Journal of Applied Physics, vol. 41 (2002), pp. 4287-4290.

Toyoda, et al., "Surface smoothing mechanism of gas cluster ion beams," Nuclear Instruments and Methods in Physics Research B 161-163 (2000) 980-985.

Panin et al., "p- to n-type Conversion in GaSb by Ion Beam Milling," Appl. Phys. Letters, vol. 67, No. 24, Dec. 1995, pp. 3584-3586.

* cited by examiner

*Primary Examiner* — Michael Band

(74) *Attorney, Agent, or Firm* — Greenblum & Bernstein, P.L.C.

(57) ABSTRACT

In a method of irradiating a gas cluster ion beam on a solid surface and smoothing the solid surface, the angle formed between the solid surface and the gas cluster ion beam is chosen to be between 1° and an angle less than 30°. In case the solid surface is relatively rough, the processing efficiency is raised by first irradiating a beam at an irradiation angle $\theta$ chosen to be something like 90° as a first step, and subsequently at an irradiation angle $\theta$ chosen to be 1° to less than 30° as a second step. Alternatively, the set of the aforementioned first step and second step is repeated several times.

9 Claims, 8 Drawing Sheets

FIG. 5    TABLE 1: EMBODIMENT 8 (SAMPLE: Si; GAS: $SF_6$)

| SMP# | FIRST STEP $\theta_p$(deg) | FIRST STEP $\theta_{r1}$(deg) | SECOND STEP $\theta_p$(deg) | SECOND STEP $\theta_{r2}$(deg) | Ra (nm) | SMP# | FIRST STEP $\theta_p$(deg) | FIRST STEP $\theta_{r1}$(deg) | SECOND STEP $\theta_p$(deg) | SECOND STEP $\theta_{r2}$(deg) | Ra (nm) |
|---|---|---|---|---|---|---|---|---|---|---|---|
| 8-1 | 5 | 0 | 5 | 3 | 0.33 | 8-28 | 25 | 0 | 25 | 3 | 0.37 |
| 8-2 | 5 | 0 | 5 | 5 | 0.12 | 8-29 | 25 | 0 | 25 | 5 | 0.13 |
| 8-3 | 5 | 0 | 5 | 10 | 0.12 | 8-30 | 25 | 0 | 25 | 10 | 0.13 |
| 8-4 | 5 | 0 | 5 | 15 | 0.11 | 8-31 | 25 | 0 | 25 | 15 | 0.14 |
| 8-5 | 5 | 0 | 5 | 20 | 0.09 | 8-32 | 25 | 0 | 25 | 20 | 0.14 |
| 8-6 | 5 | 0 | 5 | 30 | 0.1 | 8-33 | 25 | 0 | 25 | 30 | 0.13 |
| 8-7 | 5 | 0 | 5 | 45 | 0.13 | 8-34 | 25 | 0 | 25 | 45 | 0.13 |
| 8-8 | 5 | 0 | 5 | 70 | 0.11 | 8-35 | 25 | 0 | 25 | 70 | 0.14 |
| 8-9 | 5 | 0 | 5 | 90 | 0.1 | 8-36 | 25 | 0 | 25 | 90 | 0.13 |
| 8-10 | 10 | 0 | 10 | 3 | 0.35 | 8-37 | 30 | 0 | 30 | 3 | 0.63 |
| 8-11 | 10 | 0 | 10 | 5 | 0.12 | 8-38 | 30 | 0 | 30 | 5 | 0.68 |
| 8-12 | 10 | 0 | 10 | 10 | 0.13 | 8-39 | 30 | 0 | 30 | 10 | 0.75 |
| 8-13 | 10 | 0 | 10 | 15 | 0.13 | 8-40 | 30 | 0 | 30 | 15 | 0.55 |
| 8-14 | 10 | 0 | 10 | 20 | 0.11 | 8-41 | 30 | 0 | 30 | 20 | 0.51 |
| 8-15 | 10 | 0 | 10 | 30 | 0.11 | 8-42 | 30 | 0 | 30 | 30 | 0.67 |
| 8-16 | 10 | 0 | 10 | 45 | 0.12 | 8-43 | 30 | 0 | 30 | 45 | 0.64 |
| 8-17 | 10 | 0 | 10 | 70 | 0.13 | 8-44 | 30 | 0 | 30 | 70 | 0.59 |
| 8-18 | 10 | 0 | 10 | 90 | 0.12 | 8-45 | 30 | 0 | 30 | 90 | 0.56 |
| 8-19 | 20 | 0 | 20 | 3 | 0.36 | 8-46 | 35 | 0 | 35 | 3 | 2.89 |
| 8-20 | 20 | 0 | 20 | 5 | 0.12 | 8-47 | 35 | 0 | 35 | 5 | 2.77 |
| 8-21 | 20 | 0 | 20 | 10 | 0.12 | 8-48 | 35 | 0 | 35 | 10 | 2.56 |
| 8-22 | 20 | 0 | 20 | 15 | 0.12 | 8-49 | 35 | 0 | 35 | 15 | 2.34 |
| 8-23 | 20 | 0 | 20 | 20 | 0.11 | 8-50 | 35 | 0 | 35 | 20 | 2.26 |
| 8-24 | 20 | 0 | 20 | 30 | 0.12 | 8-51 | 35 | 0 | 35 | 30 | 2.78 |
| 8-25 | 20 | 0 | 20 | 45 | 0.13 | 8-52 | 35 | 0 | 35 | 45 | 2.67 |
| 8-26 | 20 | 0 | 20 | 70 | 0.13 | 8-53 | 35 | 0 | 35 | 70 | 2.55 |
| 8-27 | 20 | 0 | 20 | 90 | 0.14 | 8-54 | 35 | 0 | 35 | 90 | 2.78 |

FIG. 6 TABLE 2: EMBODIMENT 9 (SAMPLE: Si; GAS: Ar)

| SMP# | FIRST STEP $\theta_p$(deg) | FIRST STEP $\theta_{r1}$(deg) | SECOND STEP $\theta_p$(deg) | SECOND STEP $\theta_{r2}$(deg) | Ra (nm) |
|---|---|---|---|---|---|
| 9-1 | 10 | 0 | 10 | 3 | 0.58 |
| 9-2 | 10 | 0 | 10 | 5 | 0.27 |
| 9-3 | 10 | 0 | 10 | 10 | 0.27 |
| 9-4 | 10 | 0 | 10 | 15 | 0.27 |
| 9-5 | 10 | 0 | 10 | 20 | 0.26 |
| 9-6 | 10 | 0 | 10 | 30 | 0.24 |
| 9-7 | 10 | 0 | 10 | 45 | 0.21 |
| 9-8 | 10 | 0 | 10 | 70 | 0.22 |
| 9-9 | 10 | 0 | 10 | 90 | 0.2 |

FIG. 7 TABLE 3: EMBODIMENT 12 (SAMPLE: Si; GAS: $SF_6$)

| SMP# | FIRST STEP $\theta_p$(deg) | FIRST STEP $\theta_{r1}$(deg) | SECOND STEP $\theta_p$(deg) | SECOND STEP $\theta_{r2}$(deg) | Ra (nm) |
|---|---|---|---|---|---|
| 12-1 | 10 | 0 | 20 | 10 | 0.28 |
| 12-2 | 20 | 0 | 10 | 10 | 0.26 |
| 12-3 | 10 | 0 | 20 | 20 | 0.27 |
| 12-4 | 20 | 0 | 10 | 20 | 0.25 |
| 12-5 | 10 | 0 | 20 | 3 | 0.48 |
| 12-6 | 10 | 0 | 20 | 5 | 0.29 |

FIG. 8 TABLE 4: COMPARATIVE EXAMPLE 5 (GAS: $SF_6$)

| SMP# | FIRST STEP $\theta_p$(deg) | FIRST STEP $\theta_{r1}$(deg) | SECOND STEP $\theta_p$(deg) | SECOND STEP $\theta_{r2}$(deg) | SAMPLE | Ra (nm) |
|---|---|---|---|---|---|---|
| 5-1 | 5 | 0 | | | Si | 0.90 |
| 5-2 | 10 | 0 | | | Si | 0.95 |
| 5-3 | 20 | 0 | | | Si | 0.78 |
| 5-4 | 25 | 0 | | | Si | 0.75 |
| 5-5 | 30 | 0 | NONE | | Si | 3.40 |
| 5-6 | 35 | 0 | | | Si | 3.71 |
| 5-7 | 10 | 0 | | | Pt | 0.82 |
| 5-8 | 10 | 0 | | | Ni | 0.50 |
| 5-9 | 10 | 0 | | | $SiO_2$ | 0.29 |
| 5-10 | 10 | 0 | | | Cr | 0.63 |

$\theta_p=20°$ (SMP #5-3)

$\theta_p=10°$ (SMP #5-2)

METHOD FOR SMOOTHING A SOLID SURFACE

TECHNICAL FIELD

This invention is one which can be applied to the smoothing of the substrate of e.g. a semiconductor, another electronic device, or the like, and to the smoothing of a wide variety of device surfaces, and pertains to a method, and an apparatus therefor, for smoothing a solid surface by means of irradiation with a gas cluster ion beam.

BACKGROUND ART

So far, a wide variety of vapor phase reaction methods aimed at the surface smoothing, etc., of electronic devices, have been developed and put into practical use. E.g., the method of smoothing a substrate surface shown in Patent Reference 1 irradiates a substrate surface at a low angle with ions of monomer atoms or molecules of Ar (argon) gas and so on, and smoothes it by sputtering.

Moreover, in recent years, solid surface smoothing methods using a gas cluster ion beam have gained attention for enabling little surface damage and very small surface roughness. E.g., in Patent Reference 2, there is disclosed a method of reducing surface roughness by irradiating a gas cluster ion beam on a solid surface. In this method, the gas cluster ions irradiated on the object being processed are broken down by collisions with the object being processed, on which occasion there arise many-body collisions between the constituent atoms or molecules of the cluster and the constituent atoms or molecules of the object being processed, and a movement in a horizontal direction with respect to the object being processed becomes noticeable, as a result of which cutting is performed in a transverse direction with respect to the surface of the object being processed. This is a phenomenon called "lateral sputtering". By further movement of particles in a lateral direction on the surface of the object being processed, the apices of the surface are planed, the result being that atomic-size, ultra-accurate polishing is obtained. In addition, the energy held by the gas cluster ion beam is different from that of conventional ion etching in that, the energy being lower, no damage is inflicted on the surface of the object being processed, making possible the required ultra-accurate polishing. This means that solid surface smoothing method based on a gas cluster ion beam exhibits the advantage of there being less damage to the processed surface than the ion etching method shown in the aforementioned Patent Reference 1.

For smoothing based on a gas cluster ion beam, it is generally recognized that it is desirable for the direction of irradiation of the cluster ion beam on the surface of the object being processed to be one coming from a nearly perpendicular direction with respect to the surface being processed. This is to make maximum use of the effect of "surface smoothing based on lateral sputtering" described previously. However, in the aforementioned Patent Reference 2, it is described that, in case the surface being processed is a curved surface or the like, the irradiation may be in an oblique direction in response to that situation of the surface, but there is no mention regarding the effect in the case of irradiation be in an oblique direction. Consequently, in this Patent Reference 1, it comes about that the most efficient method for the smoothing of a solid surface is one where the beam is irradiated from a nearly perpendicular direction with respect to that surface.

Moreover, concerning the smoothing of a solid surface using a gas cluster ion beam, there is also an example in Patent Reference 3. There is no description in this Patent Reference 3 either of the relationship between the angle formed between the gas cluster ion beam and the solid surface, and the smoothing of the surface, so if one considers, from the disclosed description, that the "lateral sputtering" effect is used, one may consider that data for perpendicular irradiation are shown, in the same way as the previously indicated Patent Reference 2.

In addition, there is also an account pertaining to the smoothing of a solid surface based on gas cluster ion beam irradiation in Non-Patent Reference 1. Toyoda et al. carried out irradiating Ar cluster ions on surfaces of materials like Cu, SiC, and GaN and show a reduction in surface roughness. Even in this case, the work presented is irradiated by a gas cluster ion beam from a nearly perpendicular direction with respect to the surface.

Moreover, there are descriptions in Non-Patent Reference 2 regarding the changes in the roughness of a solid surface in the case of irradiating a gas cluster ion beam at various irradiation angles with respect to a solid surface. If the case of perpendicular irradiation with respect to the solid surface is taken to be 90° and the case of irradiation in parallel with the surface is taken to be 0°, it is shown that the sputtering rate, which is the speed at which the surface is etched, is the greatest for perpendicular irradiation and the etching rate decreases as the irradiation angle decreases. Regarding the relationship between surface roughness and irradiation angle, tests were performed by changing the irradiation angle to 90°, 75°, 60°, 45°, and 30°, and it was shown that the surface roughness increases as the irradiation angle decreases. No investigation was carried out experimentally for irradiation angles below 30°, but this may be thought to be due to the fact that it was judged to be of no use to carry out something like that, since surface roughness increases as the irradiation angle is decreased.

In addition, the majority of electronic devices such as integrated circuits and optical devices used in optical communications have concavo-convex patterns prepared by microshaping in solid surfaces or thin film material surfaces, but there is no account of using a gas cluster ion beam for the smoothing of the side wall surfaces of concave portions or convex portions in those concavo-convex patterns. This is because it was believed that it is difficult to irradiate a gas cluster ion beam nearly perpendicularly to the side wall surfaces of concave portions or convex portions or that the smoothing of side wall surfaces is not possible with the lateral sputtering mechanism.

As mentioned above, since, in the case of smoothing a solid surface by using a gas cluster ion beam, the surface roughness is the smallest when the irradiation angle of the gas cluster ion beam with respect to the solid surface is chosen to be 90°, and the surface roughness increases as the irradiation angle is decreased, it is not an exaggeration to say that no consideration has been given to cases other than making the irradiation angle nearly perpendicular.

Patent Reference 1: Japanese Patent Application Laid Open No. 1995-58089.
Patent Reference 2: Japanese Patent Application Laid Open No. 1996-120470.
Patent Reference 3: Japanese Patent Application Laid Open No. 1996-293483.
Non-Patent Reference 1: Japanese Journal of Applied Physics, Vol. 41 (2002), pp. 4287-4290.
Non-Patent Reference 2: Materials Science and Engineering, R34 (2001), pp. 231-295.

DISCLOSURE OF THE INVENTION

Problem to be Solved by the Invention

According to the smoothing method, disclosed in Patent Reference 1, based on sputtering the side wall faces of terraces protruding from the substrate surface by irradiating an Ar (argon) ion beam at an irradiation angle close to parallel with the substrate surface, e.g. at an angle of 5°, the convex portions present on the substrate surface are planed preferentially and are smoothed to a certain extent, but it is necessary to choose the irradiation energy to be at or below 100 eV in order to suppress damage to the substrate surface, in which case the ion current becomes very weak, so there has been the problem that it becomes impossible to obtain a practical sputtering speed.

The method, shown in Patent References 2 and 3 and Non-Patent References 1 and 2, of performing surface smoothing by irradiating a gas cluster ion beam on a solid surface and using "nearly perpendicularly incident lateral sputtering" reduces surface roughness to a certain extent, but it cannot cope with further reductions. Also, with this nearly vertically incident irradiation lateral sputtering by a gas cluster ion beam, there arises sputtering to a certain extent across the whole solid surface in the case of smoothing a surface, and there are cases where that amount of etching can not be disregarded. E.g., in case it is attempted to smooth a thin film material surface having a thin film with a thickness of something like several tens of nanometers with a surface roughness Ra of several nanometers, there are cases where an etching amount of several tens of nanometers is required when the surface roughness is reduced to something like 1 nm. In this case, there was the problem that a gas cluster ion beam could not be adopted for the smoothing of that thin film material.

Moreover, there was the problem that it was not possible to adopt a gas cluster ion beam for the smoothing of side wall surfaces of the concave or convex portions with which a concavo-convex pattern is formed and that was difficult to smooth these side wall surfaces sufficiently.

This invention is one which solves problems like these and has as an object to provide a surface smoothing method, and an apparatus therefor, making possible little surface damage as well as smaller surface roughness than for the case of conventional methods, with respect to a wide variety of devices and materials such as semiconductors.

Means for Solving Problem

The method, according to this invention, of smoothing a solid surface by using a gas cluster ion beam includes a process of irradiating the aforementioned gas cluster ion beam by making the angle formed by the aforementioned solid surface and the aforementioned gas cluster ion beam less than 30° for at least a portion of the time period of the aforementioned gas cluster ion beam irradiation process.

The smoothing apparatus according to this invention, which smoothes a solid surface by using a gas cluster ion beam, includes a gas cluster ion beam generating apparatus emitting a gas cluster ion beam and an irradiation angle setting means capable of setting the irradiation angle formed by the aforementioned solid surface with respect to the aforementioned gas cluster ion beam to less than 30°.

Effects of the Invention

As explained above, according to the present invention, it is possible, in the sample surface smoothing process based on gas cluster ion beam irradiation, to make surface roughness smaller and also to make surface damage something which is smaller, than for conventional methods, by providing for the angle of the gas cluster ion beam to be less than 30° with respect to the sample surface for at least part of the time.

BRIEF DESCRIPTION OF THE DRAWINGS

FIG. 5 is a table showing the relationship between the irradiation angles and the measured surface roughness, based on Embodiment 8.

FIG. 6 a table showing the relationship between the irradiation angles and the measured surface roughness, based on Embodiment 9.

FIG. 7 is a table showing the relationship between the irradiation angles and the measured surface roughness, based on Embodiment 12.

FIG. 8 is a table showing the relationship between the irradiation angle and the measured surface roughness, based on Comparative Example 5.

BEST MODES FOR IMPLEMENTING THE INVENTION

The mechanism of the smoothing method according to the present invention can be considered as follows. If a gas cluster ion beam irradiates a solid surface at a small angle exceeding a critical angle, the atoms or molecules forming the gas clusters recoil in a parallel direction to the solid surface without scarcely penetrating the solid surface. These recoil atoms or recoil molecules can be thought of as sputtering the protrusions of the solid surface.

At this point, if a conventional ion beam, distinct from a gas cluster ion beam, is used, in a very small domain of irradiation angles, there can be recognized an effect which at a first glance apparently resembles that of the gas cluster ion beam, but its essence is completely different. In a smoothing method using a conventional ion beam, since there is not the many-body collision effect specific to gas clusters, the phenomenon specific to gas clusters that "the atoms or molecules forming the gas clusters recoil in a parallel direction to the solid surface without scarcely penetrating the solid surface" does not occur. Consequently, the result is that the smoothing method of this invention and the smoothing method using a conventional ion beam are completely different smoothing processes. For this reason, in the surface smoothing method using a conventional ion beam, problems like those of the surface damage becoming bigger, the surface roughness reduction effect being weakened, and the processing speed becoming markedly lower are generated.

Further, the effect based on the aforementioned mechanism of the method of this invention will be called the "Oblique Incidence Surface Sputtering Effect".

Figure 1:
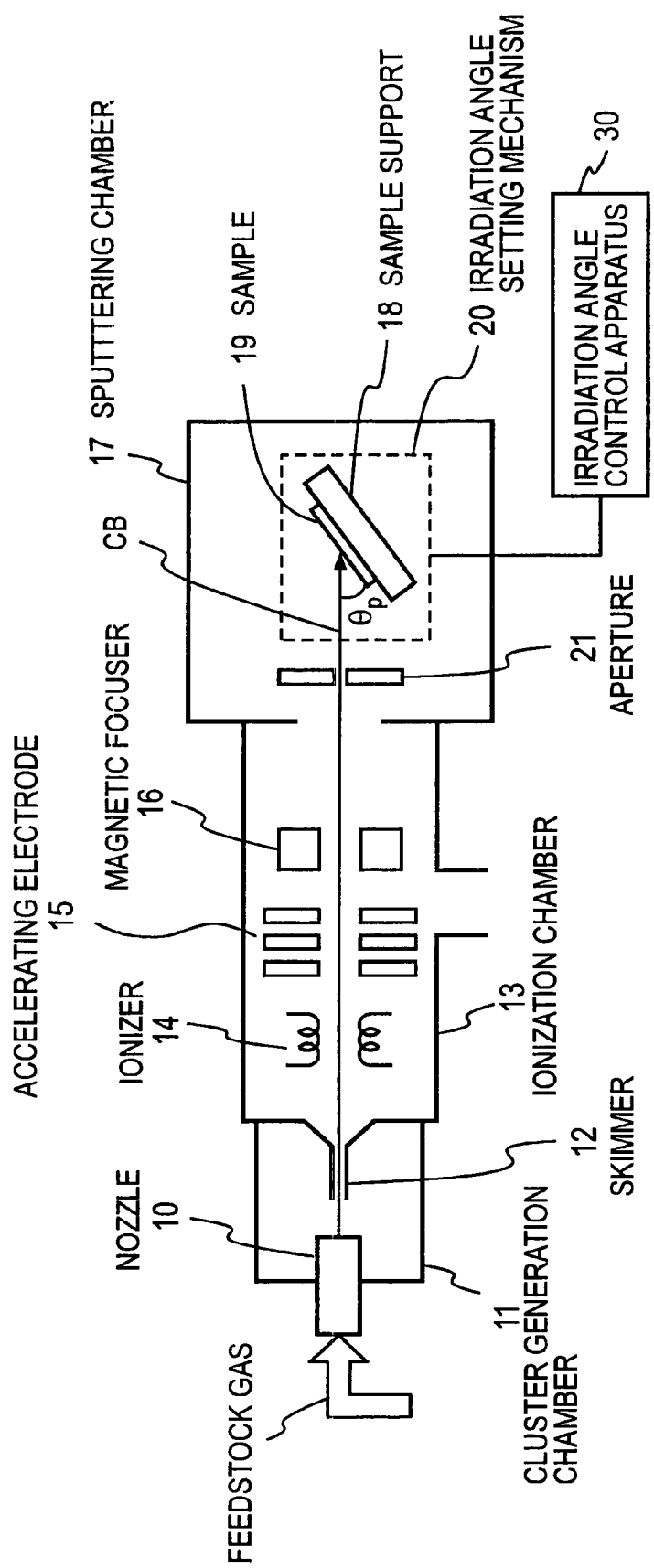
FIG. 1 is a diagram showing the basic configuration of a gas cluster ion beam smoothing apparatus implementing the solid surface smoothing method of this invention.

Below, the working modes of this invention will be explained by means of embodiments. First, the basic configuration of a gas cluster ion beam smoothing apparatus implementing the solid surface smoothing method of the present invention will be explained with reference to FIG. 1. Feedstock gases are made to be ejected from a nozzle 10 into a cluster generation vacuum chamber 11, where clusters are generated by aggregating the gas molecules. The clusters are guided through a skimmer 12 to an ionization chamber 13 as a cluster beam. In ionization chamber 13, the neutral clusters are ionized by an electron beam, e.g. thermal electrons, coming from ionizer 14. This ionized cluster beam is accelerated by means of an accelerating electrode 15, and the beam is then focused by means of a magnetic focuser 16 and made incident into a sputtering chamber 17. A sample 19 is mounted on a sample support 18 of an irradiation angle setting mechanism 20 provided inside sputtering chamber 17, and the incident cluster ion beam CB, made to have a prescribed diameter by means of an aperture 21, is irradiated on sample 19. Irradiation angle setting mechanism 20 is controlled by means of an irradiation angle control apparatus 30 so as to set the angle of the sample surface with respect to the cluster beam CB to a desired irradiation angle $\theta_p$. In cases like smoothing the surface of Sample 19, an electrical insulator, there are also cases of neutralizing the cluster ions in advance by electrons.

[First Embodiment]

Figure 2:
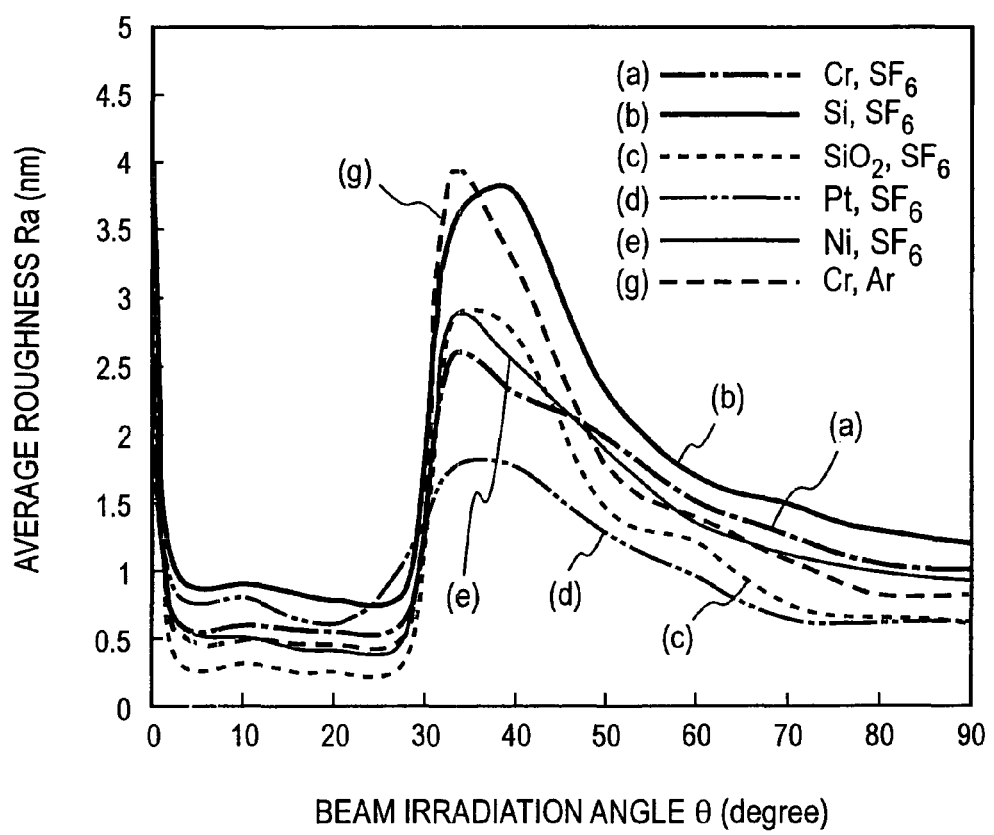
FIG. 2 is a diagram showing measured results for the surface roughness with respect to the irradiation angle.

Using a mixture of $SF_6$ gas and He gas as the feedstock gas, an $SF_6$ cluster ion beam was generated with a size distribution having a peak for clusters aggregating approximately 500 $SF_6$ molecules, and the $SF_6$ cluster ions were accelerated by 30 kV and irradiated onto sample 19 at various irradiation angles $\theta_p$ with the irradiation dose set to $4\times10^{15}$ ions/cm$^2$. The surface roughness of a sample film was measured before and after irradiation with an Atomic Force Microscope (AFM). The measured results are shown in FIG. 2. As samples, the following films, deposited on a silicon substrate by a sputtering method, were respectively used: a chromium film (curve (a)), a platinum film (curve (d)), a nickel film (curve (e)), a silicon dioxide film (curve (c)), and a silicon film (curve (b)). For an irradiation angle range of 35° to 90°, the same trend is shown as that shown in Non-Patent Reference 2, namely that the average surface roughness Ra in this range is the smallest at an irradiation angle of 90°. However, as the irradiation angle decreases below 35°, the average surface roughness abruptly decreases, the average surface roughness being nearly fixed in the range from almost 30° to 1°, these roughness values moreover being smaller than for the case of 90°.

The etching amounts of the Cr film and the Si film for the case of irradiating an $SF_6$ cluster ion beam at an irradiation angle of 25° were measured with an atomic force microscope. The results were respectively 10 nm and 340 nm. As against this, the etching amount of the Si film in the case of irradiation at 90° was 1050 nm. Further, the initial surface roughness (before irradiation) of the Cr film was 3.1 nm. Also, in order to measure the extent of damage in the surface after the smoothing process for the Si film, the profile of S (sulphur) atom penetration in the surface layer in a Si film for an irradiation angle of 25° was evaluated using the Secondary Ion Mass Spectroscopy (SIMS) method. The results were that S atoms only penetrated to a depth of something like 10 nm from the surface.

[Second Embodiment]

With the same conditions as in Embodiment 1 apart from setting the irradiation dose to $5\times10^{14}$ ions/cm$^2$, a Cr film was irradiated with $SF_6$ cluster ions at an irradiation angle of 25°. The surface roughness of the Cr film after irradiation was measured using an atomic force microscope. The surface roughness Ra measured was 0.92 nm. Since the surface roughness of the Cr film for the case of an irradiation angle of 25° in FIG. 2 and a dose of $4\times10^{15}$ ions/cm$^2$ was approximately 0.5 nm, surface roughness is reduced when the irradiation dose is increased.

[Third Embodiment]

With the same apparatus as in Embodiment 1, but using Ar instead of $SF_6$ as the feedstock gas, an Ar cluster ion beam was generated with a size distribution having a peak for clusters aggregating approximately 2000 Ar atoms, and the Ar cluster ions were accelerated by 30 kV and irradiated at various irradiation angles $\theta_p$ on a Cr film. The irradiation dose was set to $4\times10^{15}$ ions/cm$^2$. The surface roughness of the Cr film was measured before and after irradiation with an Atomic Force Microscope (AFM). The measured results are shown in curve (g) of FIG. 2. Also, the Cr film is a film formed by sputtering on a silicon substrate.

[Fourth Embodiment]

With the same conditions as in Embodiment 1, an irradiation with $SF_6$ cluster ions was carried out for the Cr film, but on that occasion, a cycle was chosen with a continuous variation of the irradiation angle $\theta_p$ with respect to one sample from 90° to 0° and again with a continuous variation from 0° to 90°, the variation being carried out in cycles of 1 s. In addition, the irradiation dose was set to $5\times10^{14}$ ions/cm$^2$. The surface roughness of the Cr film after irradiation was measured using an atomic force microscope. The surface roughness Ra measured was 0.43 nm.

[Fifth Embodiment]

With the same conditions as in Embodiment 1, the Cr film was irradiated with an $SF_6$ gas cluster ion beam, and as a first step, irradiation was carried out with an irradiation angle $\theta_p$ of 90°, the irradiation at this time being set to $3\times10^{14}$ ions/cm$^2$, and as a second step, the Cr film surface was irradiated at an irradiation angle $\theta_p$ of 25° with an irradiation dose at this time of $2\times10^{14}$ ions/cm$^2$, so as to make the total irradiation dose $5\times10^{14}$ ions/cm$^2$, the same as that in Embodiment 4. The surface roughness of the Cr film after irradiation was measured using an atomic force microscope. The surface roughness Ra measured was 0.41 nm.

[Sixth Embodiment]

A mask pattern was formed by applying a resist layer on a silicon substrate having a thermal oxide formed on it, drawing a line and space pattern (multiple parallel lines with spaces in between) by using an electron beam lithography apparatus, and developing the pattern. The line width was set to 1 μm and the space width was set to 4 μm. Through the use of a reactive ion etching apparatus, the silicon oxide layer was etched and a hard mask was formed. Subsequently, the silicon substrate was etched to a depth of something like 10 μm using radio-frequency Inductively Coupled Plasma Reactive Ion Etching (ICP-RIE).

Figure 3:
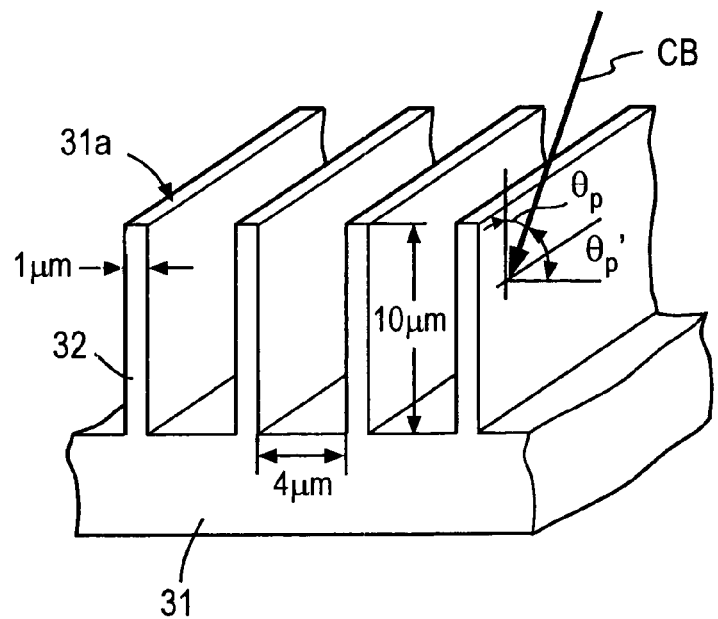
FIG. 3 is an oblique view showing an example of a solid surface in which a concavo-convex pattern is formed.

As shown in FIG. 3, what results is a plurality of lamellae 32 formed in parallel, with spaces in between, on a silicon substrate 31. I.e., a concavo-convex pattern is formed in the solid surface. The result of measuring the surface roughness of the side walls of these lamellae 32 was that the surface roughness Ra was 3.28 nm. Next, the side wall surfaces, in FIG. 3 the plate faces of lamellae 32, of the concave portions or convex portions formed in this solid surface, were irradiated with an $SF_6$ gas cluster ion beam CB under the same conditions as in Embodiment 1 at an irradiation angle $\theta_p{}'$ of 85° with respect to the irradiated substrate surface, the irradiation angle $\theta_p$ with respect to the side wall surfaces of the line and space pattern at the same time working out to 5°. The irradiation dose at this time was set to $6\times10^{13}$ ions/cm². The roughness of the side wall surfaces of the line and space pattern after irradiation was measured with an atomic force microscope. The surface roughness Ra measured was 0.34 nm.

[Seventh Embodiment]

Figure 4A:
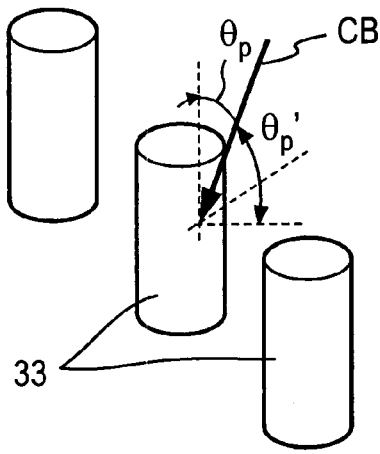
FIG. 4A is an oblique view showing an example of a concavo-convex pattern in the case of irradiating a gas cluster ion beam at a fixed irradiation angle and FIG. 4B is an oblique view showing an example of a concavo-convex pattern in the case of irradiating a gas cluster ion beam at a fixed irradiation angle while rotating the sample in its surface.
Figure 4B:
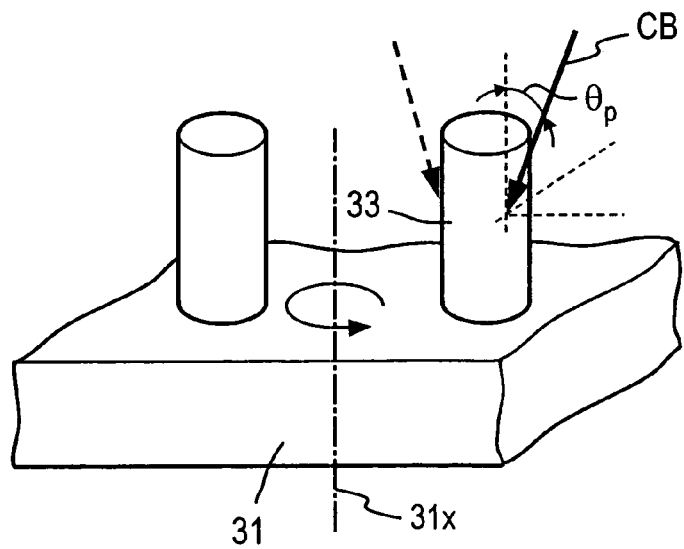

A mask pattern was formed by applying a resist layer on a silicon substrate having a thermal oxide formed on it, drawing an arrangement of circular patterns by using an electron beam lithography apparatus, and developing the pattern. The circular pattern diameter was set to 5 μm and the pitch of the arrangement of circular patterns was set to 10 μm. Through the use of a reactive ion etching apparatus, the silicon oxide layer was etched and a hard mask was formed. Subsequently, the silicon substrate was etched to a depth of something like 10 μm using radi-frequency Inductively Coupled Plasma Reactive Ion Etching (ICP-RIE). As shown in FIG. 4A, a pattern formed of multiple cylinders 33 with spaces in between, i.e. a concavo-convex pattern, is formed on silicon substrate 31. The side wall surfaces of the concave portions or the convex portions in this concavo-convex solid surface, in FIG. 4A the peripheral faces of cylinders 33, were irradiated with an $SF_6$ gas cluster ion beam CB under the same conditions as in Embodiment 1, the irradiation angle $\theta_p{}'$ with respect to the irradiated substrate surface being set to 80°. At this time, the irradiation angle $\theta_p$ with respect to the side wall surface of cylinder 33, i.e. the peripheral face thereof, does not become fixed. The irradiation was carried out so that the maximum irradiation angle $\theta_p$ becomes 10° with respect to the peripheral face in the plane containing the cylinder 33 axis for the side wall surface (peripheral face) of this cylinder 33 and the gas cluster ion beam CB. Further, as shown in FIG. 4B, substrate 31 in which cylinder 33 is formed is rotated around an axis 31x at right angles with the face of the substrate so that the entire one side wall surface (peripheral face) of cylinder 33 is irradiated by the gas cluster ion beam. The irradiation dose at this time was set to $2\times10^{14}$ ions/cm². The roughness of the side wall surface of cylinder 33 was measured with an atomic force microscope. The surface roughness Ra measured was 0.39 nm.

[Eighth Embodiment]

Using a mixture of $SF_6$ gas and He gas as the feedstock gas, an $SF_6$ cluster ion beam was generated with a size distribution having a peak for clusters aggregating approximately 500 $SF_6$ molecules, and the $SF_6$ cluster ions were accelerated by 30 kV and irradiated onto the surface of each sample 19 with a silicon film formed thereon. The irradiation with respect to the sample surfaces being carried out in two steps, at one selected irradiation angle $\theta_p$ and by changing the cluster ion beam direction (bearing angle) $\theta_r$ in the plane of projection on the faces of the samples. Specifically, irradiation was carried out with the irradiation angles ($\theta_p$, $\theta_{r1}$) in the first step, and the irradiation angles ($\theta_p$, $\theta_{r2}$) in the second step. Note, however, that bearing angle $\theta_{r2}$ is a relative value with $\theta_{r1}$ as the reference, e.g. setting $\theta_{r1}=0°$. With $\theta_p$ selected from the angles 5°, 10°, 20°, 25°, 30°, and 35° and with $\theta_{r2}$ selected from the angles 3°, 5°, 10°, 15°, 20°, 30°, 45°, 70°, and 90°, irradiation was performed for the set of all ($\theta_p$, $\theta_{r2}$) angles, with respectively differing samples 8-1 to 8-54. The irradiation doses were also set to the same value of $2\times10^{15}$ ions/cm² for the first step and the second step. The roughness of the sample surfaces before and after irradiation was measured using an atomic force microscope (AFM). The measured results are shown in Table 1 in FIG. 5.

As a sample, a Si film was deposited on a silicon substrate, by a sputtering method. Samples with a Pt film, a Ni film, an $SiO_2$ film, and a Cr film formed respectively in the same way on a silicon substrate were irradiated in the first step with an $SF_6$ cluster ion beam at the angles $\theta_p=10°$, $\theta_{r1}=0°$, and $\theta_{r2}=45°$ and the measured results for the roughness after irradiation were Ra=0.14 nm for the Pt film, Ra=0.1 nm for the Ni film, Ra=0.08 nm for the $SiO_2$ film, and Ra=0.16 nm for the Cr film. Also, regarding the Si film, the profile of S atoms penetrating the surface layer in the Si film for an irradiation angle of $\theta_p=25°$ was evaluated using the secondary ion mass spectroscopy (SIMS) method, in order to measure the extent of damage in the surface after the smoothing process. The result was that S atoms had only penetrated to a depth of something like 10 nm from the surface.

[Ninth Embodiment]

With the same apparatus as in Embodiment 8 and using Ar as the feedstock gas, an Ar cluster ion beam was generated with a size distribution having a peak for clusters aggregating approximately 2000 Ar atoms, the Ar cluster ions were accelerated by 30 kV, and, setting the irradiation angle to $\theta_p=10°$, the Si film surface was irradiated in two steps with different irradiation bearing angles $\theta_{r2}$. The irradiation dose was set to $4\times10^{15}$ ions/cm². The surface roughness of the Si film was measured regarding samples 9-1 to 9-9 before and after irradiation with an atomic force microscope (AFM). The measured results are shown in Table 2 in FIG. 6. Further, the Si film is a film formed by a sputtering method on a silicon substrate.

[Tenth Embodiment]

With the same conditions as in Embodiment 8, an irradiation with $SF_6$ cluster ions was carried out for the Si film, but on that occasion, with the irradiation angle $\theta_p$ set to 10°, the bearing angle $\theta_r$ was varied continuously from 0° to 90° and was again varied continuously from 90° to. 0° This roundtrip was repeated continuously at a rate of one cycle per second. Further, the irradiation dose was set to $4\times10^{15}$ ions/cm². The surface roughness of the Si film after irradiation was measured using an atomic force microscope. The surface roughness Ra measured was 0.09 nm. Also, the time of the concerned cycle was tested at 0.1 s and 5 s in the same way. The result was that the surface roughness Ra worked out to 0.08 nm and 0.09 nm, respectively.

Further, an experiment was performed in which the $\theta_r$ angle change quantity was set from 0° to 30°, with a cycle of 1 s. The result was that the surface roughness Ra worked out to 0.11 nm.

[Eleventh Embodiment]

Line and space pattern lamellae 32 (refer to FIG. 3), similar to those in Embodiment 6, were formed in a silicon substrate with a thermal oxide film formed thereon, and an $SF_6$ gas cluster ion beam was irradiated in the same way as in Embodiment 8 with respect to the silicon substrate in which this pattern was formed, with an irradiation angle $\theta_p$ of 5° with respect to the side wall surfaces of the line and space pattern and two irradiation bearing angles $\theta_r$. In the first step, $\theta_r$ was set to 0° and the irradiation dose to $2\times10^{15}$ ions/cm², and in the second step, $\theta_r$ was set to 10° and the irradiation dose to $2\times10^{15}$ ions/cm². The surface roughness of the side walls of the line and space pattern were measured after irradiation with an atomic force microscope. The surface roughness Ra measured was 0.12 nm.

[Twelfth Embodiment]

With the exception of changing the irradiation angle $\theta_p$ in the first step and the second step, irradiation was carried out with a gas cluster ion beam in the same way as in Embodiment 8, by combining a number of different $\theta_p$ and $\theta_r$ angles. The measured results are shown in Table 3 in FIG. 7.

FIRST COMPARATIVE EXAMPLE

Using a commercially available ion beam etching apparatus, an $SF_6$ ion beam was generated, the $SF_6$ ions were accelerated by 30 kV and irradiated on a Cr film, a Pt film, an $SiO_2$ film, and an Si film similar to those used in Embodiments 1 and 8. The irradiation dose was set to $4\times10^{15}$ ions/cm$^2$. The surface roughness of the surfaces of various materials before and after irradiation was measured using an atomic force microscope. The result was that the surface roughness Ra of the surfaces of the various materials worked out to 2 nm or more for any irradiation condition. Also, the profile of S atoms penetrating the surface layer in the Si film was evaluated using the secondary ion mass spectroscopy (SIMS) method, in order to measure the extent of damage in the surface after the smoothing process. The result was that S atoms had penetrated as deeply as 40 to 50 nm from the surface.

SECOND COMPARATIVE EXAMPLE

A solid surface having the concavo-convex pattern shown in FIG. 3 was formed with the same conditions as those of Embodiment 6. Without irradiating this solid surface with a gas cluster ion beam, the surface roughness of the side wall surfaces of the concave portions or the convex portions, in FIG. 3 the plate faces of lamellae 32, was measured with an atomic force microscope. The surface roughness Ra measured was 3.28 nm.

THIRD COMPARATIVE EXAMPLE

With the exception of setting the irradiation angle of the gas cluster ion beam with respect to substrate surface 31a to 90°, the same conditions were chosen as in Embodiment 6. The roughness of the side wall surfaces of the concave portions or the convex portions was measured with an atomic force microscope. The surface roughness Ra measured was 3.03 nm.

FOURTH COMPARATIVE EXAMPLE

A mask pattern was formed by applying a resist layer on a silicon substrate having a thermal oxide formed on it, drawing a line and space pattern by using an electron beam lithography apparatus, and developing the pattern. Using a reactive ion etching apparatus, the silicon oxide layer was etched and a hard mask was formed. Subsequently, the masked silicon substrate was irradiated with an $SF_6$ gas cluster ion beam under the same conditions as those in Embodiment 1 and etched, but this was done in such a way that the irradiation angle $\theta_p$ with respect to the substrate surface became 90°. The irradiation dose at this time was set to $2\times10^{15}$ ions/cm$^2$. After this irradiation, concavo-convex surfaces of parallel linear grooves with spaces in between, i.e. a line and space pattern, were formed in the silicon substrate. The roughness of the side walls of those grooves, i.e. the side wall surfaces of the concave portions or the convex portions occurring in the solid surface having concavo-convex portions, was measured with an atomic force microscope. The surface roughness Ra measured was 2.17 nm.

FIFTH COMPARATIVE EXAMPLE

Choosing basically the same conditions as in Embodiment 8 with the exception of irradiating in the first step without changing the irradiation bearing angle $\theta_r$, GCIB (Gas Cluster Ion Beam) irradiation was carried out for a Si film, a Pt film, an $SiO_2$ film, and a Cr film. The irradiation dose was set to $4\times10^{15}$ ions/cm$^2$. The measured results are shown in Table 4 in FIG. 8.

SIXTH COMPARATIVE EXAMPLE

Using a commercially available ion beam etching apparatus, an $SF_6$ ion beam was generated, the $SF_6$ ions were accelerated by 30 kV and irradiated on an Si film, a Pt film, an $SiO_2$ film, and a Cr film similar to those used in Embodiment 8. The irradiation angle conditions and the irradiation dose were also chosen to be the same as in Embodiment 1. The surface roughness of the surfaces of various materials before and after irradiation was measured using an atomic force microscope. The result was that, in the same way as in Comparative Example 1, the surface roughness Ra of the surfaces of the various materials worked out to 2 nm or more for any irradiation condition. Also, the profile of S atoms penetrating the surface layer in the Si film was evaluated using the secondary ion mass spectroscopy (SIMS) method, in order to measure the extent of damage in the surface after the smoothing process, the result being, in the same way as in Comparative Example 1, that S atoms had penetrated as deeply as 40 to 50 nm from the surface.

SEVENTH COMPARATIVE EXAMPLE

The same conditions were chosen as in Embodiment 11, with the exception of forming a line and space pattern and adopting one type for the irradiation bearing angle $\theta_r$ of the gascluster ion beam. The surface roughness of the side walls of this line and space pattern was measured with an atomic force microscope. The surface roughness Ra measured was 2.98 nm.

[Investigation]

By referring to Embodiment 1, Embodiment 3, and Comparative Example 1, the following can be seen. As the irradiation angle $\theta_p$ of a gas cluster ion beam is decreased from 90° (vertical irradiation), the surface roughness increases relatively monotonically down to an irradiation angle $\theta_p$ of 30°. When the irradiation angle $\theta_p$ becomes smaller than 30°, it is seen that the surface roughness is reduced abruptly, and moreover, that it even becomes smaller than the surface roughness in the case of irradiation at 90°. Even if irradiation angle $\theta_p$ is decreased further, the state of small surface roughness continues, but when it reaches a value less than 1°, the surface roughness again increases abruptly.

In the state of 0° irradiation, the solid surface is hardly etched, and in this case, the value of the surface roughness can be considered to be one which reflects the surface roughness of the initial state of the various films. What should be paid attention to here is that in case irradiation is carried out at less than 30°, a fairly low surface roughness is realized compared to the case of nearly perpendicular irradiation. This result is one which indicates that it is possible, compared to conventional solid surface smoothing methods based on nearly perpendicular irradiation, to make surface roughness considerably smaller with the solid surface smoothing method of the present invention.

Also, since similar results are obtained even in the cases of using chemically reactive $SF_6$ gas and chemically inert Ar gas as gas cluster types, it is seen that the solid surface smoothing method according to this invention does not depend on the type of gas cluster. Further, as for the types of smoothed materials, since similar results are obtained for chemically reactive Si and chemically inert Pt with respect to $SF_6$ clusters, it is seen that the solid surface smoothing method according to this invention does not depend on the type of material smoothed.

In the results for a conventional ion beam, which is not a gas cluster, of Comparative Example 1, no marked smoothing of solid surfaces can be seen, so the superiority of this invention using gas cluster ion beams can be confirmed.

In addition, if one attempts to compare the extent of damage occurring in the surfaces after the smoothing process, S atoms penetrate. and inflict damage as deep as 40 to 50 nm from the surface with methods based on conventional ion beams, whereas they only inflict damage at 10 nm or less with the present invention, so it is seen that it is possible to implement a solid surface smoothing method with very low damage by using the present invention.

Further, if one attempts to look at the etching amount of the solid surface during the smoothing process, with the perpendicular irradiation according to the conventional methods, there is a very large etching amount for the Si film, 1050 nm, but with 25° incidence conditions according to the present invention, the Si film etching amount works out to 340 nm, one third or less of the conventional amount, so it is seen that it is possible to implement surface smoothing with a remarkably low etching amount. With a Cr film having an initial roughness of 3.1 nm, even with a roughness of something like 0.5 nm after irradiation, the etching amount does not exceed 10 nm. By this effect of a small etching amount, it is seen that this invention is suitable for smoothing, etc., of thin-film materials.

Next, the following can be seen by referring to Embodiments 4 and 5. By irradiating the gas cluster ion beam while varying the angle formed by the solid surface and the gas cluster ion beam, not irradiating at only a single gas cluster ion beam irradiation angle $\theta_p$, it is seen that it is possible to reduce surface roughness in a short time (with a condition of a small irradiation dose). Also, even by using an irradiation angle $\theta_p$ of 90° in the first step and using an irradiation angle $\theta_p$ of 25° in the second step, as the angles formed by the solid surface and the gas cluster ion beam, it is seen that it is possible to reduce surface roughness in a short time (with a condition of a small irradiation dose). From the graph shown in FIG. 2, roughly speaking, it would be acceptable to set the irradiation angle $\theta_p$ to 30° or more in the first step and to less than 30° in the second step, but it is appreciated that, preferably, it would be acceptable to set the irradiation angle to 50° to 90° in the first step and to 1° to 30° in the second step.

It is considered that this method of changing the irradiation angle $\theta_p$ and using a second-step angle is particularly valid for the following samples. In the case that the surface of the sample is relatively smooth, it is considered that it is the most valid to choose an irradiation angle $\theta_p$ of this invention to be less than 30°, but in the case that the roughness of the surface is relatively large, it results that, when looking at the micro level, there are domains present which have various angles in the surface. In the case of domains like these having various angles in the surface, there are cases when it is more efficient to smooth with an e.g. nearly perpendicular irradiation. As is evident when looking at FIG. 2, as for the range of angles in which it is possible to obtain nearly fixed smoothing when varying the irradiation angle $\theta_p$, the vicinity of nearly perpendicular irradiation becomes the largest, since it can be considered that the curves of FIG. 2 are symmetrical about the 90° axis.

If one considers the vicinity of 25°, which lies inside the valid range of irradiation angles evident from this FIG. 2, smoothing becomes difficult if the irradiation angle $\theta_p$ is shifted by 10° to 35°. As against this, even if the irradiation angle $\theta_p$ is shifted by ±20° with an irradiation at 90° to become 110° or 70°, the surface roughness is in a nearly fixed range and it hardly ever occurs that smoothing becomes difficult, as can be understood from FIG. 2. Consequently, in case the sample surface roughness is relatively big, the method of carrying out irradiation by setting the irradiation angle $\theta_p$ to a relatively large value, e.g. within ±20° from a central value of 90° and, after smoothing has been advanced to a certain extent, advancing the smoothing further under the condition of an irradiation angle $\theta_p$ smaller than 30°, becomes efficient. Also, in the case that the roughness of the sample surface is similarly relatively big, it is appreciated that it is possible to carry out smoothing efficiently if the irradiation angle $\theta_p$ is repeatedly varied continuously between 90° and 0°. In this case, it is acceptable to repeatedly vary the angle $\theta_p$ from 0° to 90° to 180° to 90° to 0°, straddling an axis at right angles with the sample surface. It is valid to utilize irradiation in the irradiation angle range according to this invention from 1° or more to less than 30° as a finishing process, i.e. to carry out irradiation at an irradiation angle which is 1° or more and less than 30° at least in the last process in smoothing processing including various modes in which the irradiation angle is varied.

Figure 9A:
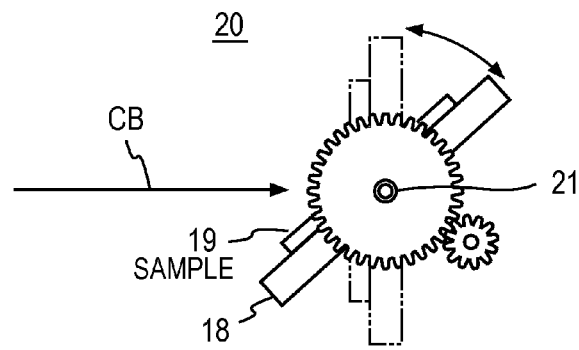
FIG. 9A is a side elevational view of an example of an irradiation angle setting mechanism and FIG. 9B is a front elevational view thereof and a diagram showing a configuration example of an irradiation angle control apparatus.
Figure 9B:
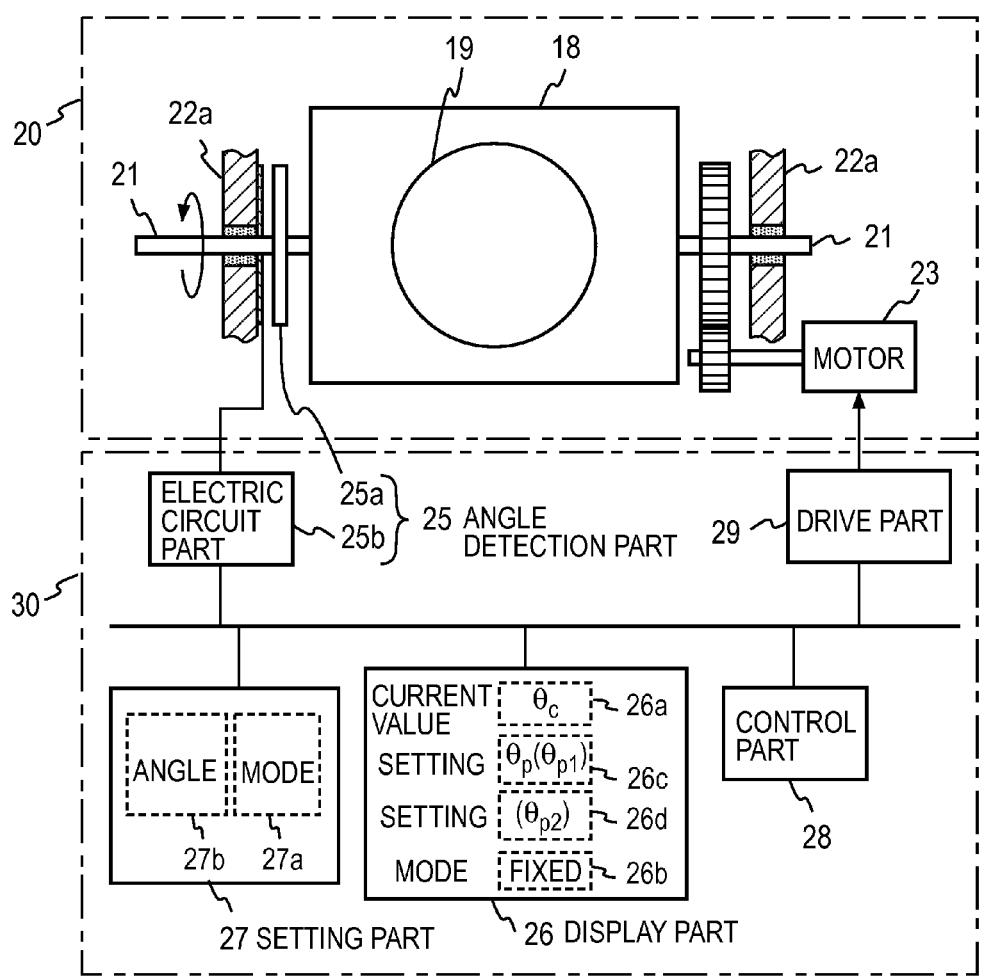

From the explanation above and the graph of FIG. 2, it is appreciated that the continuous change of the irradiation angle $\theta_p$ in Embodiment 4 may be one wherein the angle is continuously changed between any angle of 30° or more and any angle less than 30°, preferably between any angle between 50° and 90° and any angle from 1° or more to 30°. Also, even the technique with which the angle is changed continuously need not be one which functions while having the angle make roundtrips, a possibility being that the angle is repeatedly changed continuously from a big angle to a small angle or from a small angle to a big angle. As will be described subsequently with reference to FIGS. 9A and 9B, from the point of view of the simplicity of the mechanism and control for making the irradiation angle $\theta_p$ repeatedly change continuously, roundtrip operation is easier. In addition, the starting angle and the ending angle of the repetition of the continuous change may be arbitrary, but it is appreciated that in the case of a low number of repetitions, it is better, if one dare say so, for the angle at the ending time to be smaller.

The number of times that the continuous change in this irradiation angle $\theta_p$ is repeated may be 1 or higher within the time of the entire smoothing process, but it is more effective to choose a number of several tens of times to more than several hundreds of times. Consequently, the rate at which the irradiation angle is changed is not one which is limited to 1 cycle per second, as shown in Embodiment 4.

Next, it will be investigated in which proportions the first step and the second step in Embodiment 5 should be performed. In Embodiment 5, the initial surface roughness Ra (average value) is 3.1 nm, and Rmax (peak value) is something like 30 nm. When the surface is smoothed, Ra is changed to 0.41 nm and Rmax to something like 4 nm, but since the surface of the initial condition has concave-convex portions, it exhibits a shape having a variety of angles, if one looks at the microscopic level. It is expected that the surface has an angular distribution of something like 30°. If this angular distribution is large, in case smoothing is carried out by irradiation according to this invention, and the irradiation angle $\theta_p$ is chosen to be e.g. 15°, the result is that there is a domain which is actually irradiated at 45° (15°+30°), so the efficiency is bad in this region, i.e. if one looks at the microscopic level, the result is that there is a domain which is not smoothed. Consequently, since by making the angular distribution of this surface, viewed from a microscopic level, be 15° or less in the first step, it becomes 30° (15°+15°), so it can be considered that the smoothing efficiency rises. In the example of Embodiment 5, by making Ra something like half (1.5 nm), the surface can be considered to fall within the range described above (actually, it can be considered, for the reason mentioned below, that a reduction by as much as half is not necessary). The fact of reducing this Ra to something like half is nearly equivalent to carrying out the irradiation in the first step to something like half the initial roughness.

This example is a typical industrial application example, but since there are actually various cases, irradiation may be carried out in the first step as far as e.g. reducing the surface roughness by 10% of the initial value or more (to 90% or less). This is because, if the smoothing of a face with large angles due to concave-convex portions of the surface viewed on a microscopic level is carried out to reduce the surface roughness as much as the aforementioned 10%, it is expected that it will fall within the aforementioned range (an angular distribution viewed at the microscopic level of something like 15% or less) because the efficiency of smoothing by irradiating a gas cluster ion beam is high (stated the other way round, it takes more time to further reduce something which has small roughness).

Regarding the second step, it is efficient to allot to the second step approximately 10% or more of the whole processing time for the first step and the second step. The reason for that is that, in Embodiment 5 based on the following, the processing time is on the order of 10 to 30 minutes with the current apparatus, but after processing in the first step, the surface roughness Ra of 3.1 nm has become something like 1 nm. Because the roughness of 1 nm is changed to something like 0.4 nm in the second step, a processing time equal to or greater than the time needed for smoothing the difference in absolute Ra values becomes necessary, i.e. 1 nm–0.4 nm=0.6 mm as against 3.1 nm–1 nm=2.1 nm, so the result is that a time equal to or greater than 20% of the whole processing time needs to be allotted to the second step. Generally, as in the aforementioned first step, it is acceptable to allot to the second step approximately 10% or more of the total processing time for the first step and the second step, as mentioned above.

As mentioned above, according to this invention, in case the irradiation angle $\theta_p$ is chosen to have a fixed value of less than 30°, and in case two steps are chosen, various modes like the repetition of a continuous variation can be considered. In the apparatus of this invention, shown in FIG. 1, the apparatus is set up to be able to set the mode setting and the irradiation angle $\theta_p$. This apparatus, as e.g. shown respectively in FIG. 9A, for an irradiation angle setting mechanism 20, and in FIG. 9B, for the top face thereof as well as an irradiation angle control apparatus 30, as for sample support 18, there is mounted an encoder plate 25a of an angle detection part 25 detecting, as a digital value, the rotation angle of sample support 18 between a rotation shaft 21 and a fixed plate 22a, i.e. the irradiation angle $\theta_p$ of the gas cluster ion beam CB with respect to the face being smoothed of a sample 19 mounted on sample support 18. Irradiation angle control apparatus 30 is composed of an electric circuit part 25b, a display part 26, a setting part 27, a control part 28, and a drive part 29. A detected angle (irradiation angle) $\theta_c$, coming from electric circuit part 25b of angle detection part 25, is displayed in the current angle area 26a of display part 26.

When a fixed mode is set by manipulating mode setting part 27a in setting part 27 and the targeted irradiation angle $\theta_p$ is input by manipulating angle setting part 27b, "Fixed" is displayed in mode area 26b of display part 26, the set irradiation angle is displayed in set angle area 26c, and a motor 23, driven via control part 28 and drive part 29, is controlled so that the actual angle $\theta_c$ becomes the set angle $\theta_p$.

When a two-step mode setting is input and $\theta_{p1}$, $\theta_{p2}$ are input in order as settings for the irradiation angles, "Two-step" is displayed in the mode area, the initial setting angle $\theta_{p1}$ is displayed in set angle area 26c and the second-time setting angle $\theta_{p2}$ is set in set angle area 26d, respectively, and the drive of motor 23 is controlled so that, on the occasion of the aforementioned first-step processing by control part 28, the current angle $\theta_c$ becomes the angle $\theta_{p1}$ of set angle area 26c. On the occasion of the second-step processing, the drive of motor 23 is controlled so that $\theta_c$ becomes the angle $\theta_{p2}$ of set angle area 26d.

When the continuous variation mode setting is input and $\theta_{p1}$, $\theta_{p2}$ are sequentially input as settings for the angles, "Continuous variation" is displayed in the mode area, set angles $\theta_{p1}$ and $\theta_{p2}$ are displayed in set angle areas 26c and 26d, and motor 23 is controlled so that the irradiation angle $\theta_p$ with respect to the beam is repeatedly moved back and forth by control part 28 between the two set angles $\theta_{p1}$ and $\theta_{p2}$.

Control part 28 is a part in which the irradiation angle setting program for the aforementioned various displays, the various drives of motor 23, and so forth, is executed by means of a CPU (Central Processing Unit) or a microprocessor. Setting part 27 is an input means for the keyboard, etc. This mode and angle setting device is installed in the control apparatus of a smoothing processing apparatus capable of setting various conditions for this smoothing process. Further, the smoothing apparatus of this invention may also be an apparatus in which the irradiation angle $\theta_p$ is fixed to less than 30°, i.e. an apparatus in which the irradiation angle $\theta_p$ can not be varied.

When the irradiation dose varies, the etched amount of material varies, this etching amount being nearly proportional to the irradiation dose. Also, directly after the start of the irradiation, the surface roughness is decreased, together with the increase in the irradiation dose, but when the surface roughness is decreased to a certain extent, it never occurs that the surface roughness decreases beyond that. This is something close to the region in which, regarding the irradiation doses used in each of the previous embodiments, the surface roughness decreases to a certain extent but does not decrease beyond this. Since the relationship between irradiation dose and surface roughness is the above-mentioned relationship, the irradiation dose may have a small value, there being no minimum value for the dose. It is generally preferable to use the smallest irradiation dose possible to implement the targeted surface roughness. This is because manufacturability is normally higher with a shorter smoothing process time, because it is frequent that the smoothed materials are film materials, and because it is desirable to have a smaller reduction of film thickness (etching amount) accompanying the smoothing.

In each of the embodiments above, the accelerating voltage was assumed to be 30 kV. The higher the accelerating voltage is, the greater the etching amount becomes, but it can be seen that the processing time becomes shorter. However, the relationship between accelerating voltage and surface roughness is currently not understood. Consequently, it is acceptable to determine the accelerating voltage as well, by various conditions like the time and material required for the smoothing process, and it may be chosen to be in the range of something like 10 to 45 kV.

Further, the following can be seen by referring to Embodiment 6, Embodiment 7, and Comparative Examples 2 to 4. The roughness values of the side wall surfaces of the concave portions or the convex portions in a solid surface provided with a concavo-convex pattern differ markedly by etching method and the processing method thereof. In the conventional etching method shown in Comparative Example 2, it is seen that the magnitude of the roughness of the side walls of the concave portions or the convex portions is great. Even if using the gas cluster ion beam shown in Comparative Example 3 and Comparative Example 4, it is seen that surface roughness does not diminish in the case that the irradiation angle of the beam is perpendicular to the surface desired to be smoothed, i.e. if the irradiation angle $\theta_p$ with the surface (the side wall surfaces of concave portions or convex portions) desired to be smoothed is 90°. Compared to that, by making the irradiation angle $\theta_p$ with the surface desired to be smoothed greater than 0° and smaller than 30°, as in Embodiment 6 of the present invention, it becomes possible to markedly reduce the roughness of the side wall surfaces of the concave portions or the convex portions. Also, it is seen that this invention can be applied effectively to side wall surfaces of concave portions or convex portions which are not plane surfaces, like curved surfaces, as described in Embodiment 7.

In this way, it is seen that this invention can be applied not only to smooth solid surfaces but also to the smoothing of side wall surfaces of concave portions or convex portions occurring in surfaces with concavo-convex patterns formed by etching and the like, as well as to planes and curved surfaces having various angles. This is to say that side wall surfaces of concave portions or convex portions do not have to be perpendicular faces with respect to the substrate. Moreover, even regarding the smoothing of side wall surfaces of concave portions or convex portions, it may be appreciated that effective smoothing is possible by continuously varying the angle $\theta_p$, as in Embodiment 4, or by two-step irradiation with changed angles $\theta_p$, as in Embodiment 5.

In the foregoing, an investigation was carried out within an irradiation angle range from 0° to 90°, since it is evident that the surface roughness characteristics with respect to the irradiation angle in FIG. 2 work out to being symmetrical about the 90° axis, so if the range of e.g. 1° or more to less than 30° according to this invention is taken to be a domain A and the range from 35° or more to 90° or less is taken to be a domain B and the domains symmetrical about the 90° axis to these are respectively taken to be domains A'=180°−A and B'=180°−B, irradiation modes with various combinations of domains A, A', B, and B' including irradiation processes based on irradiation angles $\theta_p$ in at least one domain of the domains A and A' are possible with this invention. Also, it is acceptable to carry out multi-step irradiation based on multiple irradiation angles selected from these combinations, and it is acceptable to carry out at least once continuous changes of irradiation angles between those. These arbitrary irradiation modes can be easily implemented by the configuration shown in FIGS. 9A and 9B.

The following can be seen by referring to Embodiment 8 and Comparative Example 5. It is seen that, if irradiation is carried out in two steps at two different bearing angles $\theta_r$ in the plane of projection of the beam on the sample face with respect to the irradiation angle $\theta_p$ of the gas cluster ion beam, the surface roughness becomes smaller than for the same irradiation dose at a single angle $\theta_r$. It is also seen that the surface roughness effect is further increased, if the value of this second-step angle $\theta_r$ is 5° or more.

With reference to Embodiments 8 and 9 and Comparative Example 5, it is seen that the surface roughness reduction effect due to using a second-step bearing angle $\theta_r$ does not depend on the type of sample or on the type of gas cluster. Also, regarding the angle $\theta_p$, it is seen that there is a marked effect at 30° or less.

In the result due to a conventional ion beam, distinct from a gas cluster ion beam, of Comparative Example 6, noticeable smoothing of the solid surface similar to the case of Comparative Example 1 can not be observed, so the superiority of this invention using the gas cluster ion beam of Embodiment 8 can be confirmed. The reason why noticeable smoothing does not occur for a conventional ion beam and noticeable smoothing does occur for a gas clustear ion beam of the present invention can be considered in the following way. If a gas cluster ion beam is irradiated obliquely, the clusters collide and recoil, but the recoil directions thereof are mostly distributed in directions within the face of the concerned solid surface. This can be thought of as a mechanism similar to the "lateral sputtering" occurring in the case of vertical irradiation of the gas cluster ion beam on the solid surface. In the case of oblique irradiation at e.g. $\theta_p$=20°, the recoiling atoms or molecules are mostly distributed at angles for which $\theta_p$ is less than 20°. The result is that, in this way, recoiling atoms or molecules collide again with the protrusions of the solid surface and smooth the pointed ends of the protrusions. Moreover, in case a conventional ion beam is irradiated obliquely, and if $\theta_p$=20°, the recoiling atoms or molecules have angles with a distribution centered on 20°, the same as the irradiation angle. The result is that, in the case of this conventional ion beam, the probability that recoil atoms or molecules smooth the protrusions becomes very small.

Next, it will be attempted to reflect on the distribution of bearing angle $\theta_r$ directions. If a gas cluster ion beam is irradiated obliquely, it recoils with a distribution of the $\theta_r$ angles as well. The distribution range is wider than for the case of a conventional ion beam, but since there is a distribution, a texture parallel to the irradiation angle is formed. The dimensions of this texture restrict the reduction in surface roughness. Moreover, an attempt will be made to consider the case of irradiating beams from at least two types of directions on the plane of projection of the solid surface. It was discovered for the first time with this invention that, if a cluster ion beam is irradiated from the concerned second type of direction, the formation of a texture formed in parallel with the concerned irradiation direction is noticeably suppressed. This is a characteristic that can not be observed with a conventional ion beam.

By mechanisms like these, the superiority of the present invention can be explained.

In addition, if one attempts to compare the extent of damage occurring in the surface after the smoothing process, as against a situation with S atoms penetrating and inflicting damage as deeply as 40 to 50 nm from the surface with a method based on a conventional ion beam, in the same way as in Comparative Example 1, they only inflict damage at 10 nm or less with this invention, so it is seen that it is possible to implement smoothing with very low damage of a solid surface by using this invention.

By referring to Embodiments 8 and 10, even in the case of choosing two steps for the angle $\theta_r$ or in the case of continuously varying the angle, it is seen that there is an effect of reducing the surface roughness in the same way. It is seen that this is something for which it is essentially important to choose a condition in which the angle $\theta_r$ is not single, but does not depend on the number of multiple steps which do not have to be two steps but can e.g. be three steps or four steps. Also, it is seen that the range of angles continuously varied may also be arbitrary.

By referring to Embodiment 11 and Comparative Example 7, it is seen that the effect of reducing surface roughness by a method with the angle $\theta_r$ not being fixed, like changing it in two steps or continuously varying it, can also be applied to the pattern side wall surfaces. From this result, it is seen that it is possible to apply the solid surface smoothing method of the present invention to three-dimensional and complex surfaces, curved surfaces, and the like.

By referring to Embodiment 8 and Embodiment 12, it is seen that the effect of reducing surface roughness by using two-step bearing angles $\theta_r$ is higher when the first-step angle $\theta_p$ and the second-step angle $\theta_p$ are the same. This phenomenon is something which has become experimentally evident for the first time with this invention. This can be thought of in the following way. Regarding the smoothing effect of the solid surface, it is seen that there is not much $\theta_p$ dependence due to the irradiation of the first step in the domain $\theta_p<30°$, as shown in Comparative Example 5. However, as shown by the atomic force spectroscopy photographs after smoothing by irradiation with a cluster ion beam, for samples 5-3 and 5-2 in FIGS. 10A and 10B, it was seen that the morphologies thereof are very different. In the case of carrying out gas cluster ion beam irradiation in the second step, the explanation is that it is carried out with respect to this kind of surface morphology formed in the first step. As a result of assiduously carrying out an investigation in accordance with the present invention, it has become evident that, depending on the way of combining the steps, there are differences in the surface smoothing effects of the second step.

Figure 10A:
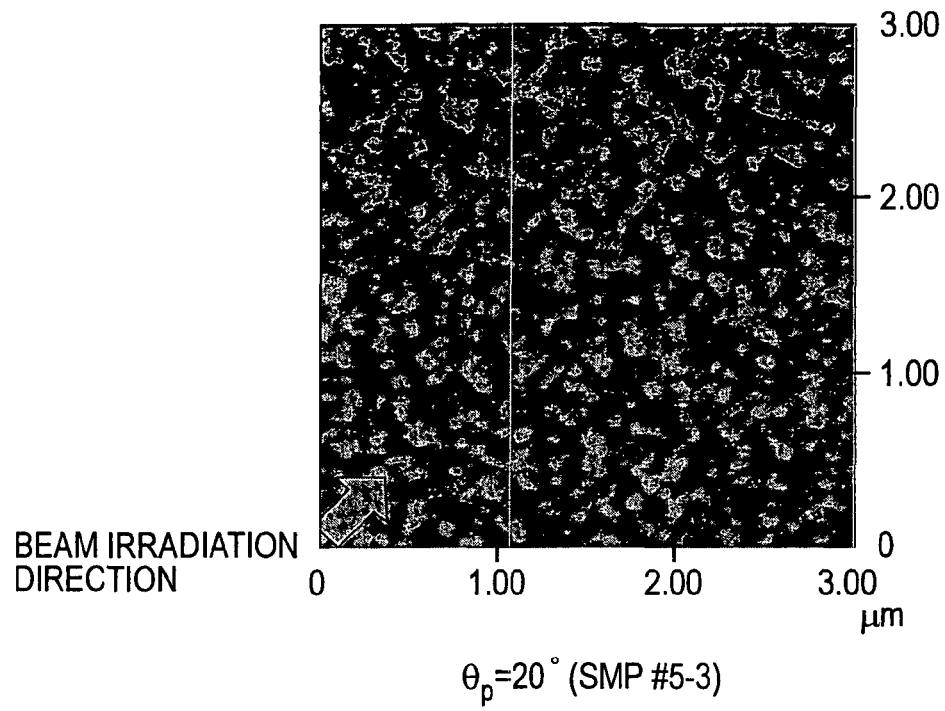
FIG. 10A is an atomic force microscopy photograph showing the surface condition of Sample 5-3 having the irradiation angle $\theta_p=20°$ of Comparative Example 5 and FIG. 10B is a photograph of Sample 5-2.
Figure 10B:
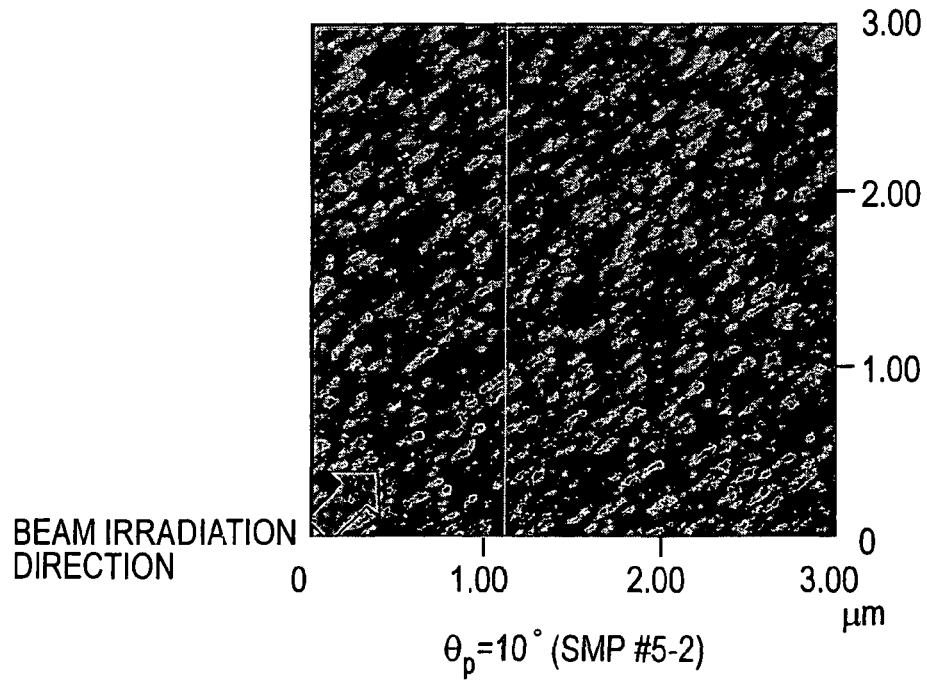

When looking at FIGS. 10A and 10B, it looks like there are streaks attached in the irradiation direction, and it is seen that the thickness and length of those streaks differ. By the present invention, it has become evident that the length of these streaks has a tendency to become longer, the smaller the angle $\theta_p$ becomes. Further, in order to smooth the surface so as to shave off the surface in units of the width and the length of these streaks, it is inferred, regarding the irradiation in the first step and the second step, that it is more effective when the units thereof match. When one e.g. considers that the depth of the streaks in the second step is in a state of being shallower than in the first step, it means that the smoothing effect in the second step becomes smaller. Because of this, the result is that the smoothing effect is stronger when the $\theta_p$ angles of the first step and the second step are the same.

Figure 11A:
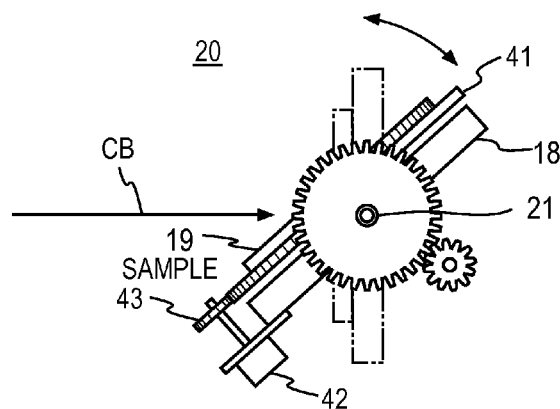
FIG. 11A is a side elevational view of another example of an irradiation angle setting mechanism.
Figure 11B:
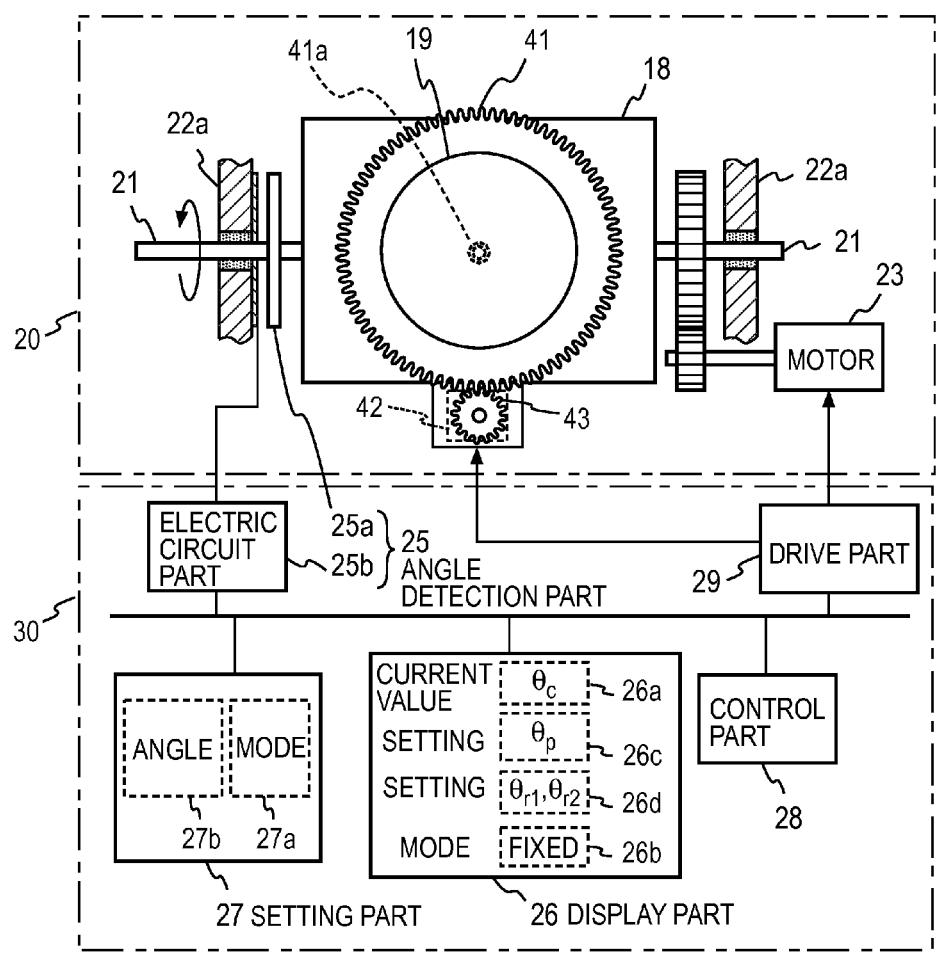
FIG. 11B is a front elevational view thereof and a diagram showing a configuration example of an irradiation angle control apparatus.

As mentioned above, according to this invention, in case irradiation angle $\theta_r$ is chosen to have a fixed value of less than 30°, and in case two steps are chosen, various modes like the repetition of a continuous variation can be considered. In the smoothing apparatus taking into account the execution of Embodiments 8 to 11, the apparatus is set up to enable a mode setting and irradiation angle ($\theta_p$, $\theta_r$) settings. As e.g. shown in FIGS. 11A and 11B, on the plate face of a sample holder 18 similar to that in FIGS. 9A and 9B, there is provided a cogwheeled rotary disk 41 rotatably supported by an shaft 41a, upon which a sample 19 is supported. The cogwheel serving as rotary disk 41 is coupled to a cogwheel 43 mounted on the shaft of a stepping motor 42 mounted on sampler holder 18 and rotary disk 41 can be rotated only a desired angle $\theta_r$ by a rotation of stepping motor 42. As for stepping motor 42, pulses in a number corresponding to the angle or are supplied by drive part 29.

When a fixed mode is set by manipulating mode setting part 27a in setting part 27 and the targeted irradiation angle $\theta_p$ is input by manipulating angle setting part 27b, "Fixed" is displayed in mode area 26b in display part 26, the set irradiation angle is displayed in set angle area 26c, and a motor 23, driven via control part 28 and drive part 29, is controlled so that the actual angle $\theta_c$ becomes the set angle $\theta_p$.

When a two-step mode setting is input and $\theta_p$, $\theta_{r1}$, $\theta_{r2}$ are input in order as settings for the irradiation angles, "Two-step" is displayed in the mode area, the initial setting angle $\theta_p$ is displayed in set angle area 26c and the set angles $\theta_{r1}$ and $\theta_{r2}$ are set in set angle area 26d, respectively, and the drive of motor 23 is controlled so that the current angle $\theta_c$, on the occasion of the aforementioned first-step processing by control part 28, becomes the angle $\theta_p$, and motor 42 is controlled so that the rotation angle $\theta_r$ of rotary disk 41 becomes $\theta_{r1}$. In the second-step processing, the angle $\theta_p$ is maintained as is and the drive of motor 42 is controlled so that the angle $\theta_r$ becomes the angle $\theta_{r2}$.

When the continuous variation mode setting is input and $\theta_p$, $\theta_{r1}$, $\theta_{r2}$ are input in order as settings for the angles, "Continuous variation" is displayed in the mode area, and motor 23 is controlled by control part 28 so that the irradiation angle becomes $\theta_p$, and motor 42 is further repeatedly moved back and forth so as to change continuously between the two set angles $\theta_{r1}$ and $\theta_{r2}$.

Control part 28 is a part in which the irradiation angle setting program for the aforementioned various displays, the various drives of motors 23 and 42, and so forth, are executed by means of a CPU (Central Processing Unit) or a microprocessor. Setting part 27 is an input means for the keyboard, etc. This mode and angle setting device is installed in the control apparatus of a smoothing processing apparatus capable of setting various conditions for this smoothing process.

As is evident from the description above, the gas types used for gas cluster ion beams are not limited to $SF_6$ or Ar but can be of any type and, moreover, apparatus conditions and experimental parameters like irradiation conditions and cluster sizes are not particularly restricted, any conditions and parameters being acceptable.

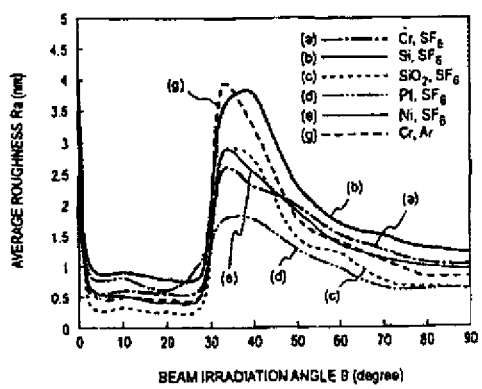

What is claimed is:

1. A method of smoothing a solid surface by etching the solid surface with a gas cluster ion beam, comprising:
   a) irradiating the solid surface with the gas cluster ion beam with an irradiation angle between a plane defined by the solid surface and the gas cluster ion beam being equal to or greater than 30°; and
   b) irradiating, after step a), the solid surface with the gas cluster ion beam with the irradiation angle being less than 30°, resulting in smoothing the solid surface,
   wherein the gas cluster ion beam is either one of Ar gas cluster ion beam or $SF_6$ gas cluster ion beam; and
   the solid consists essentially of any one of chromium, platinum, nickel, silicon dioxide and silicon.

2. A method of smoothing a solid surface by etching the solid surface with a gas cluster ion beam, comprising:
   a) irradiating the solid surface with the gas cluster ion beam with a first irradiation angle between a plane defined by the solid surface and the gas cluster ion beam being equal to or greater than 30°;
   b) irradiating the solid surface with the gas cluster ion beam with a second irradiation angle between the plane and the gas cluster ion beam being less than 30°;
   c) repeating one or more times a continuous change of an irradiation angle between the first irradiation angle and the second irradiation angle while irradiating the solid surface with the gas cluster ion beam; and d) irradiating, as a final step, the solid surface with the gas cluster ion beam with the second irradiation angle, resulting in smoothing the solid surface, wherein the gas cluster ion beam is either one of Ar gas cluster ion beam or $SF_6$ gas cluster ion beam; and the solid consists essentially of any one of chromium, platinum, nickel, silicon dioxide and silicon.

3. A method of smoothing a solid surface by etching the solid surface with a gas cluster ion beam, comprising:
  a) irradiating the solid surface with the gas cluster ion beam in a first direction with an irradiation angle between a plane defined by the solid surface and the gas cluster ion beam being less than 30°, the first direction being defined by a projection of the gas cluster ion beam onto the plane;
  b) irradiating the solid surface with the gas cluster ion beam in a second direction with an irradiation angle between the plane and the gas cluster ion beam being less than 30°, the second direction being defined by a projection of the gas cluster ion beam onto the plane and the second direction being different from the first direction; and
  c) performing the step a) or b) as a final step, resulting in smoothing the solid surface,
wherein the gas cluster ion beam is either one of Ar gas cluster ion beam or $SF_6$ gas cluster ion beam; and
the solid consists essentially of any one of chromium, platinum, nickel, silicon dioxide and silicon.

4. The method of claim 3 comprising varying the direction continuously back and forth between the first direction and the second direction while irradiating the solid surface with the gas cluster ion beam.

5. The method according to claim 4, wherein the irradiation angle between the gas cluster ion beam and the solid surface is fixed during step a).

6. The method of claim 3, wherein the second direction is 5° or more away from the first direction.

7. The method according to claim 6, wherein the irradiation angle between the gas cluster ion beam and the solid surface is fixed during step a).

8. The method according to any one of claims 1, 2, 4 and 6, wherein the solid surface is a side wall surface of a concave structure or a convex structure.

9. A method of smoothing a solid surface by etching the solid surface with a gas cluster ion beam, comprising:
  a step of irradiating the solid surface with the gas cluster ion beam with an irradiation angle between a plane defined by the solid surface and the gas cluster ion beam being less than 30° for at least a portion of a time period of a gas cluster ion beam irradiation, resulting in smoothing the solid surface,
  wherein the solid is a thermal oxide film formed on a substrate; and
  the gas cluster ion beam is either one of Ar gas cluster ion beam or $SF_6$ gas cluster ion beam.

* * * * *

UNITED STATES PATENT AND TRADEMARK OFFICE
CERTIFICATE OF CORRECTION

| | | |
|---|---|---|
| PATENT NO. | : 8,764,952 B2 | Page 1 of 3 |
| APPLICATION NO. | : 10/573942 | |
| DATED | : July 1, 2014 | |
| INVENTOR(S) | : A. Sato et al. | |

It is certified that error appears in the above-identified patent and that said Letters Patent is hereby corrected as shown below:

On the Title Page

Delete Title Page illustration figure, and replace with new Title Page illustrating new figure. (attached)

In the Specification

Column 7, line 25, of the printed patent, "radi-frequency" should be changed to --radio-frequency--.

Column 10, line 42, of the printed patent, "gascluster" should be changed to --gas cluster--.

Column 11, line 20, of the printed patent, "atoms penetrate. and inflict" should be changed to --atoms penetrate and inflict--.

Column 16, line 18, of the printed patent, "clustear" should be changed to --cluster--.

Column 17, line 51, of the printed patent, "in case e" should be changed to --in case the--.

Column 17, line 66, of the printed patent, "or" should be changed to --$\theta_r$--.

In the Claims

Column 18, line 53 (claim 1, line 12), of the printed patent, "solid consists" should be changed to --solid surface consists--.

Column 19, line 6 (claim 2, line 19), of the printed patent, "solid consists" should be changed Signed and Sealed this
Twenty-eighth Day of October, 2014

Michelle K. Lee
*Deputy Director of the United States Patent and Trademark Office*

CERTIFICATE OF CORRECTION (continued)
U.S. Pat. No. 8,764,952 B2 to --solid surface consists--.

Column 19, line 26 (claim 3, line 19), of the printed patent, "solid consists" should be changed to --solid surface consists--.

Column 20, line 24 (claim 9, line 9), of the printed patent, "solid is" should be changed to --solid surface is--.

(12) United States Patent
Sato et al.

(10) Patent No.: US 8,764,952 B2
(45) Date of Patent: *Jul. 1, 2014

(54) METHOD FOR SMOOTHING A SOLID SURFACE

(75) Inventors: Akinobu Sato, Soka (JP); Akiko Suzuki, Akishima (JP); Emmanuel Bourelle, Musashimurayama (JP); Jiro Matsuo, Kyoto (JP); Toshio Seki, Kyoto (JP); Takaaki Aoki, Kyoto (JP)

(73) Assignee: Japan Aviation Electronics Industry Limited, Tokyo (JP)

(*) Notice: Subject to any disclaimer, the term of this patent is extended or adjusted under 35 U.S.C. 154(b) by 2089 days.

This patent is subject to a terminal disclaimer.

(21) Appl. No.: 10/573,942

(22) PCT Filed: Sep. 29, 2004

(86) PCT No.: PCT/JP2004/014275
§ 371 (c)(1),
(2), (4) Date: Mar. 29, 2006

(87) PCT Pub. No.: WO2005/031838
PCT Pub. Date: Apr. 7, 2005

(65) Prior Publication Data
US 2006/0278611 A1 Dec. 14, 2006

(30) Foreign Application Priority Data

Sep. 30, 2003 (JP) .................... 2003-339566
Mar. 15, 2004 (JP) .................... 2004-072642

(51) Int. Cl.
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |
| B44C 1/22 | (2006.01) |
| C03C 15/00 | (2006.01) |
| C03C 25/68 | (2006.01) |
| C23F 1/00 | (2006.01) |
| A61N 5/00 | (2006.01) |
| G21G 5/00 | (2006.01) |
| G21K 5/10 | (2006.01) |
| H01J 37/08 | (2006.01) |
| C23C 14/02 | (2006.01) |
| H01L 21/302 | (2006.01) |
| H01L 21/461 | (2006.01) |

(52) U.S. Cl.
USPC ......... 204/192.34; 204/192.35; 204/192.37; 204/298.31; 204/298.36; 216/58; 216/63; 216/66; 216/72; 250/492.1; 250/492.2; 250/492.21; 250/492.3; 427/534; 438/712

(58) Field of Classification Search
USPC ............. 438/384, 712; 204/192.34, 192.35, 204/192.37, 298.31, 298.36; 427/404, 534; 250/492.1, 492.2, 492.21, 492.3; 216/58, 63, 66, 72
See application file for complete search history.

(56) References Cited

U.S. PATENT DOCUMENTS

| 6,375,790 | B1 | 4/2002 | Fenner |
| 6,486,478 | B1* | 11/2002 | Libby et al. ............. 250/492.1 |
| 6,624,081 | B2 | 9/2003 | Dykstra et al. |
| 7,064,927 | B2* | 6/2006 | Erickson et al. ......... 360/135 |
| 7,116,394 | B2* | 10/2006 | Bakker et al. ........... 355/30 |
| 7,231,705 | B2* | 6/2007 | Kagami et al. .......... 29/603.15 |
| 8,178,857 | B2* | 5/2012 | Sato et al. ............. 250/492.3 |
| 8,481,981 | B2* | 7/2013 | Suzuki et al. ........... 250/492.3 |
| 2002/0000552 | A1* | 1/2002 | Morimoto et al. ........ 257/59 |
| 2002/0001680 | A1* | 1/2002 | Hoehn et al. ........... 427/551 |
| 2004/0086752 | A1 | 5/2004 | Matsukawa et al. |
| 2004/0137158 | A1* | 7/2004 | Kools et al. ........... 427/404 |
| 2008/0315128 | A1 | 12/2008 | Sato et al. |
| 2010/0207041 | A1 | 8/2010 | Sato et al. |
| 2010/0230616 | A1* | 9/2010 | Suzuki et al. .......... 250/492.3 |